United States Patent
Wong et al.

(10) Patent No.: US 10,510,662 B2
(45) Date of Patent: Dec. 17, 2019

(54) VERTICALLY ORIENTED METAL SILICIDE CONTAINING E-FUSE DEVICE AND METHODS OF MAKING SAME

(71) Applicant: GLOBALFOUNDRIES Inc., Grand Cayman (KY)

(72) Inventors: Chun Yu Wong, Ballston Lake, NY (US); Kwan-Yong Lim, Niskayuna, NY (US); Seong Yeol Mun, Cohoes, NY (US); Jagar Singh, Clifton Park, NY (US); Hui Zang, Guilderland, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/805,282

(22) Filed: Nov. 7, 2017

(65) Prior Publication Data

US 2019/0139892 A1   May 9, 2019

(51) Int. Cl.
| | | |
|---|---|---|
| H01L 21/76 | (2006.01) | |
| H01L 23/525 | (2006.01) | |
| H01L 23/522 | (2006.01) | |
| H01L 23/532 | (2006.01) | |
| H01L 21/768 | (2006.01) | |
| H01L 23/528 | (2006.01) | |
| H01L 21/3105 | (2006.01) | |

(52) U.S. Cl.
CPC .... *H01L 23/5256* (2013.01); *H01L 21/76877* (2013.01); *H01L 23/528* (2013.01); *H01L 23/5226* (2013.01); *H01L 23/53209* (2013.01); *H01L 21/31053* (2013.01)

(58) Field of Classification Search
CPC combination set(s) only.
See application file for complete search history.

(56) References Cited

U.S. PATENT DOCUMENTS

| | | | |
|---|---|---|---|
| 8,530,319 B2 | 9/2013 | Gebreselasie et al. | |
| 9,728,542 B1* | 8/2017 | Balakrishnan | .... H01L 29/66742 |
| 10,043,746 B1* | 8/2018 | Cheng | ................. H01L 23/5256 |
| 2007/0099326 A1* | 5/2007 | Hsu | ..................... H01L 23/5252 |
| | | | 438/48 |
| 2012/0275208 A1* | 11/2012 | Li | ........................... H01L 21/84 |
| | | | 365/96 |
| 2015/0014809 A1* | 1/2015 | Wang | ..................... H01L 29/861 |
| | | | 257/506 |
| 2015/0187431 A1* | 7/2015 | Chung | ................. G11C 17/165 |
| | | | 365/96 |

OTHER PUBLICATIONS

Kothandaraman et al., "Electrically Programmable Fuse (eFUSE) Using Electromigration in Silicides," IEEE Electron Device Letters, 23:523-25, Sep. 2002.
Tonti, "eFuse Design and Reliability," IBM Semiconductor Research and Development Corporation.

* cited by examiner

*Primary Examiner* — Moin M Rahman
(74) *Attorney, Agent, or Firm* — Amerson Law Firm, PLLC

(57) ABSTRACT

One illustrative method disclosed herein comprises forming a vertically oriented semiconductor (VOS) structure in a semiconductor substrate and performing a metal silicide formation process to convert at least a portion of the VOS structure into a metal silicide material, thereby forming a conductive silicide vertically oriented e-fuse.

18 Claims, 17 Drawing Sheets

VERTICALLY ORIENTED METAL SILICIDE CONTAINING E-FUSE DEVICE AND METHODS OF MAKING SAME

BACKGROUND OF THE INVENTION

1. Field of the Invention

The present disclosure generally relates to the fabrication of semiconductor devices, and, more particularly, to various embodiments of a novel vertically oriented metal silicide containing e-fuse device and methods of making such a device.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (NMOS and PMOS transistors) represent one important type of circuit element that substantially determines performance of such integrated circuits. During the fabrication of complex integrated circuits using, for instance, MOS technology, millions of transistors, e.g., NMOS transistors and/or PMOS transistors, are formed on a substrate including a crystalline semiconductor layer. A field affect transistor, whether an NMOS or a PMOS device, is a planar device that typically includes a source region, a drain region, a channel region that is positioned between the source region and the drain region, and a gate structure positioned above the channel region. The gate structure is typically comprised of a very thin gate insulation layer and one or more conductive layers that act as a conductive gate electrode. In a field effect transistor, the conductivity of the channel region, i.e., the drive current capability of the conductive channel, is controlled by applying an appropriate voltage to the gate electrode.

Field effect transistors come in a variety of different configurations, e.g., planar devices, FinFET devices, vertical transistor devices, etc. As technology advances, there is a constant demand to reduce the overall size of the IC products to reduce the size of the consumer products incorporating such IC products. Vertical transistor devices, with their vertically oriented channel structure, present one promising choice for advanced IC products given the potential space savings achieved by using such devices. Modern integrated circuit (IC) products typically include a very large number of active individual circuit elements, such as field effect transistors, as well as numerous passive circuit elements, such as capacitors, resistors and the like. These circuit elements are combined in various arrangements to make integrated circuits that perform a variety of functions so as to enable the IC product to perform its intended function.

For a variety of reasons, the various circuit portions may have significantly different performance capabilities, for instance with respect to useful lifetime, reliability and the like. For example, the operating speed of a digital circuit portion, such as a CPU core and the like, may depend on the configuration of the individual transistor elements and also on the characteristics and performance of the metallization system coupled to the CPU core. Consequently, the combination of the various circuit portions in a single semiconductor device may result in a significantly different behavior with respect to performance and reliability. Variations in the overall manufacturing process flow may also contribute to further variations in the performance capabilities between various circuit portions. For these reasons, in complex integrated circuits, frequently, additional mechanisms are used so as to allow the circuit itself to adapt or change the performance of certain circuit portions to comply with the performance characteristics of other circuit portions. Such mechanisms are typically used after completing the manufacturing process and/or during use of the semiconductor device. For example, when certain critical circuit portions no longer comply with corresponding device performance criteria, adjustments may be made, such as re-adjusting an internal voltage supply, re-adjusting the overall circuit speed and the like, to correct such underperformance.

In computing, e-fuses are used as a means to allow for the dynamic, real-time reprogramming of computer chips. Speaking abstractly, computer logic may generally be "etched" or "hard-coded" onto a silicon chip and cannot be changed after the chip has been manufactured. By utilizing an e-fuse, or a number of individual e-fuses, a chip manufacturer can change some aspects of the circuits on a chip. If a certain sub-system fails, or is taking too long to respond, or is consuming too much power, the chip can instantly change its behavior by blowing an e-fuse. Programming of an e-fuse is typically accomplished by forcing a large electrical current through the e-fuse. This high current is intended to break or rupture a portion of the e-fuse structure, which results in an "open" electrical path. In some applications, lasers are used to blow e-fuses. Fuses are frequently used in integrated circuits to program redundant elements or to replace identical defective elements. Further, e-fuses can be used to store die identification or other such information, or to adjust the speed of a circuit by adjusting the resistance of the current path. Device manufacturers are under constant pressure to produce integrated circuit products with increased performance and lower power consumption relative to previous device generations. This drive applies to the manufacture and use of e-fuses as well.

The present disclosure is directed to various embodiments of a novel vertically oriented metal silicide containing e-fuse device for use on integrated circuit (IC) products, methods of making such e-fuse devices and IC products and the resulting IC products.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various embodiments of a novel vertically oriented metal silicide containing e-fuse device for use on integrated circuit products, methods of making such e-fuse devices and products and the resulting integrated circuit products. One illustrative method disclosed herein includes forming a vertically oriented semiconductor (VOS) structure in a semiconductor substrate and performing a metal silicide formation process to convert at least a portion of the VOS structure into a metal silicide material, thereby forming a conductive silicide vertically oriented e-fuse.

One illustrative integrated circuit product disclosed herein includes a vertically oriented semiconductor (VOS) structure positioned above a semiconductor substrate, wherein at least a portion of the vertical height of the VOS structure is a conductive silicide vertically oriented e-fuse, wherein the conductive silicide vertically oriented e-fuse comprises a metal silicide material that extends through at least a portion of an entire lateral width of the VOS structure, and a conductive metal silicide region in the semiconductor substrate that is conductively coupled to the conductive silicide vertically oriented e-fuse.

Another illustrative integrated circuit product disclosed herein includes a vertically oriented semiconductor (VOS) structure positioned above a semiconductor substrate, wherein at least a portion of the vertical height of the VOS structure is a conductive silicide vertically oriented e-fuse, wherein the conductive silicide vertically oriented e-fuse comprises a metal silicide material that extends through at least a portion of an entire lateral width of the VOS structure, and first and second doped regions in the semiconductor substrate, wherein the first and second doped regions are oppositely doped and constitute a diode and wherein one of the first and second doped regions is positioned vertically below the VOS structure.

BRIEF DESCRIPTION OF THE DRAWINGS

The disclosure may be understood by reference to the following description taken in conjunction with the accompanying drawings, in which like reference numerals identify like elements, and in which.

Figure 1:
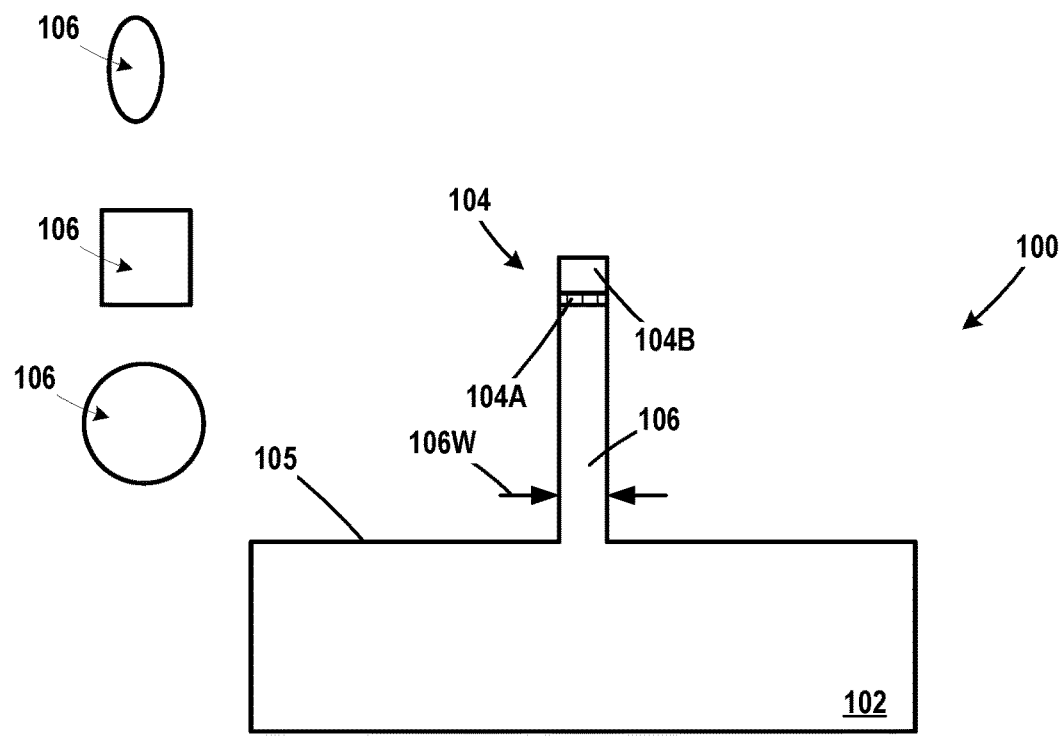
FIGS. 1-28 are various views that depict various novel embodiments of a novel vertically oriented metal silicide containing e-fuse device for use on IC products, methods of making such e-fuse devices and IC products and the resulting IC products.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various embodiments of a novel vertically oriented metal silicide e-fuse device for use on IC products, methods of making such e-fuse devices and IC products and the resulting IC products. As will be appreciated by those skilled in the art after a complete reading of the present application, the methods disclosed herein may be employed to form a gate structure-to-source/drain conductive contact structure in a variety of different applications. For example, the methods disclosed herein may be employed to form a gate structure-to-source/drain conductive contact structure on an SRAM device. Other applications where such cross-coupled contact structures may be employed include, but are not limited to, various devices that are typically found in the logic portion of an IC product, etc. Thus, the inventions disclosed and claimed herein should not be considered to be limited to any particular application where such cross-coupled contacts may be formed. With reference to the attached figures, various illustrative embodiments of the methods and devices disclosed herein will now be described in more detail.

FIGS. 1-13 are various views that depict one illustrative embodiment of a novel vertically oriented metal silicide containing e-fuse device for use on an IC product 100, methods of making such e-fuse devices and IC products and the resulting IC product 100. The product 100 will be formed in and above a semiconductor substrate 102. The substrate 102 may have a variety of configurations, such as the bulk substrate configuration depicted herein or a semiconductor-on-insulator (SOI) configuration. Such an SOI substrate includes a bulk semiconductor layer, a buried insulation layer positioned on the bulk semiconductor layer and an active semiconductor layer positioned on the buried insulation layer, wherein the e-fuse devices disclosed herein are formed in and above the active layer. The active layer and/or the bulk semiconductor layer may be made of silicon or they may be made of semiconductor materials other than silicon, and they both do not have to be made of the same semiconductor material. Thus, the terms "substrate" or "semiconductor substrate" should be understood to cover all semiconducting materials and all forms of such materials.

FIG. 1 depicts the IC product 100 after several process operations were performed. First, a vertically oriented semiconductor (VOS) structure 106 was formed in the substrate 102. The VOS structure 106 was formed by performing one or more etching processes through a patterned etch mask 104 so as to define a plurality of trenches 105 in the substrate 102. In the illustrated examples, the VOS structures 106 have a rectangular cross-section when viewed from above. In other embodiments, the VOS structures 106 may have a different cross-sectional shape, such as circle, oval, square, etc., as shown in the upper left-hand portion of FIG. 1. The patterned etch mask 104 is intended to be representative in nature as it may be comprised of multiple layers of material, such as, for example, the depicted silicon dioxide layer 104A and the silicon nitride layer 104B. Thus, the particular form and composition of the patterned etch mask 104 should not be considered a limitation of the presently disclosed inventions. As initially formed, the VOS structure 106 has a dimension 106W (e.g., a lateral width), the magnitude of which may vary depending upon the particular application. In one illustrative embodiment, the VOS structure 106 may be formed at the same time as various vertically oriented channel semiconductor structures (not shown) are formed for various vertical transistor devices (not shown) that will be formed on the substrate 102.

Figure 2:
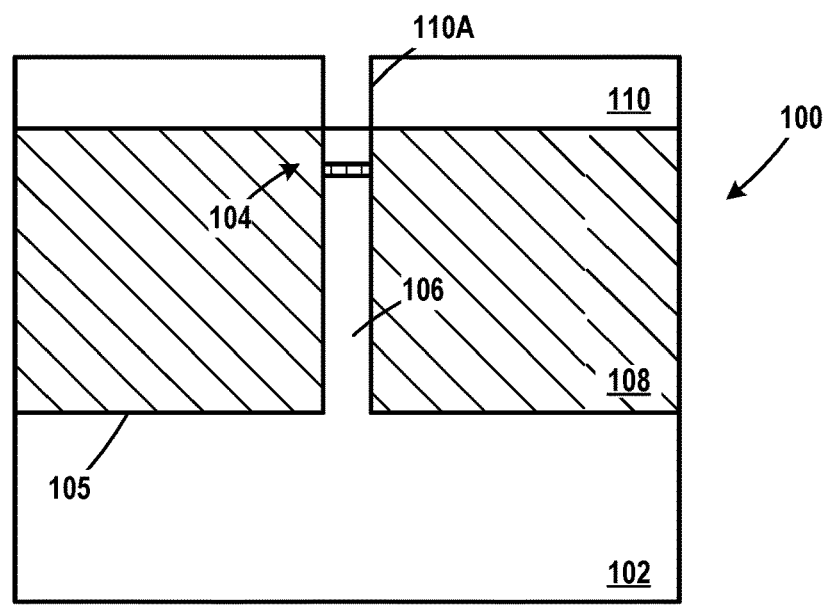

FIG. 2 depicts the product 100 after several process operations were performed. First, a layer of insulating material 108, such as silicon dioxide, was deposited so as to over-fill the trenches 105 such that insulating material 108 was positioned above the upper surface of the patterned etch mask 104. Thereafter, a CMP process was performed to planarize the upper surface of the deposited layer of insulating material 108 with the upper surface of the patterned etch mask 104. Then, a patterned mask layer 110, e.g., a patterned layer of photoresist, with an opening 110A formed therein, was formed above the layer of insulating material 108. The opening 110A is positioned above the VOS structure 106. Of course, in a real-world setting, the opening 110A may be made much larger so as to expose the patterned etch mask 104 above each of several VOS structures 106 that are formed across the substrate.

Figure 3:
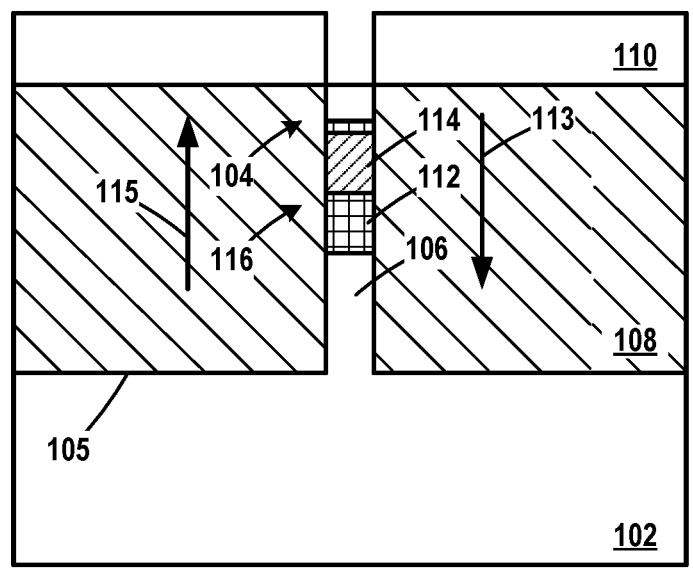

FIG. 3 depicts the product after a first doped region 112 and a second doped region 114 were formed in the VOS structure 106. As will be described more fully below, the first and second doped regions 112, 114 are oppositely-doped regions that define a P/N junction and a diode structure 116. In one illustrative embodiment, the first doped region 112 may be a P-doped region, while the second doped region 114 may be an N-doped region, wherein the diode 116 would allow electron current flow in the direction 113 and block electron current flow in the direction 115. The concentration of dopant atoms in the first and second doped regions 112, 114 may vary depending upon the particular application, and the dopant concentration in each of the first and second doped regions 112, 114 need not be the same, although that may be the case in some situations. In one illustrative embodiment, the doped regions 112, 114 may be formed by performing separate ion implantation processes through the patterned mask layer 110. The dopant dose and implant energy used during such ion implantation processes to form the first and second doped regions 112, 114 may vary depending upon the particular application. Additionally, the vertical position of the first and second doped regions 112, 114 along the vertical height of the VOS structure 106 may vary depending upon the particular application.

Figure 4:
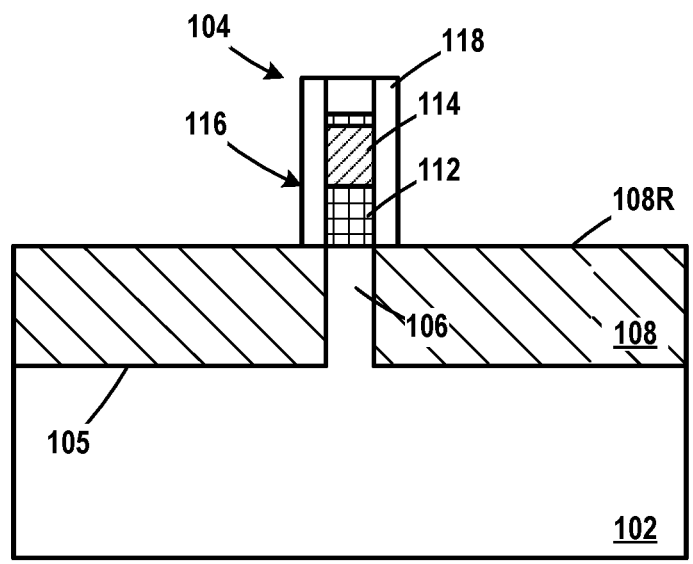

FIG. 4 depicts the product 100 after several process operations were performed. First, the patterned mask layer 110 was removed. Then, a recess etching process was performed to recess the layer of insulating material 108 such that it has a recessed upper surface 108R that exposes a portion of the vertical height of the VOS structure 106. The amount of recessing of the layer of insulating material 108 may vary depending upon the particular application. In general, the layer of insulating material 108 should be recessed to a degree such that a significant portion (if not all) of the first doped region 112 is positioned above the recessed surface 108R. Next, a simplistically-depicted sidewall spacer 118 was formed adjacent the exposed portion of the VOS structure 106 and above the recessed layer of insulating material 108. The sidewall spacer 118 was formed by performing a conformal deposition process to form a conformal layer of spacer material above the VOS structure 106 and above the recessed layer of insulating material 108. Thereafter, an anisotropic etching process was performed to remove the horizontally positioned portions of the layer of spacer material, thereby leaving the sidewall spacer 118 positioned on opposite sidewalls of the VOS structure 106. The sidewall spacer 118 may be made of any desired material that may be selectively etched relative to the material of the recessed layer of insulating material 108, e.g., silicon nitride, silicon oxynitride, etc., when the recessed layer of insulating material 108 is made of silicon dioxide. The thickness of the sidewall spacer 118 (at its base) may vary depending upon the particular application.

Figure 5:
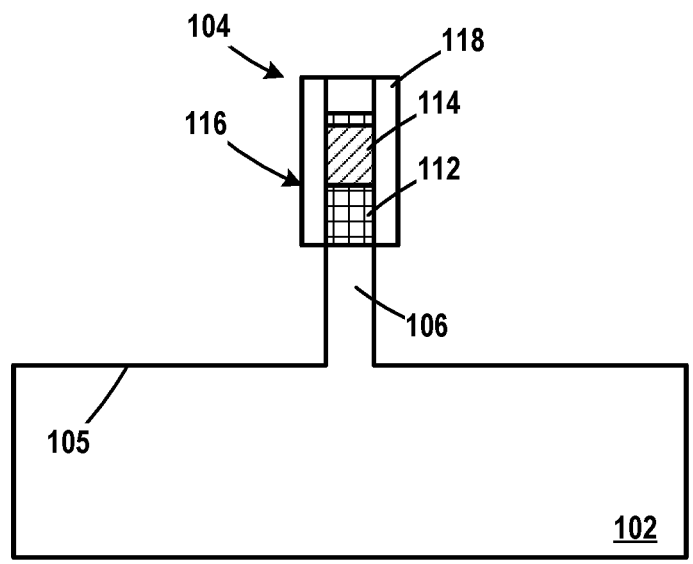

FIG. 5 depicts the product 100 after an etching process was performed to remove the recessed layer of insulating material 108. This process operation exposes a portion of the vertical height of the VOS structure 106 below the diode 116 for further processing.

Figure 6:
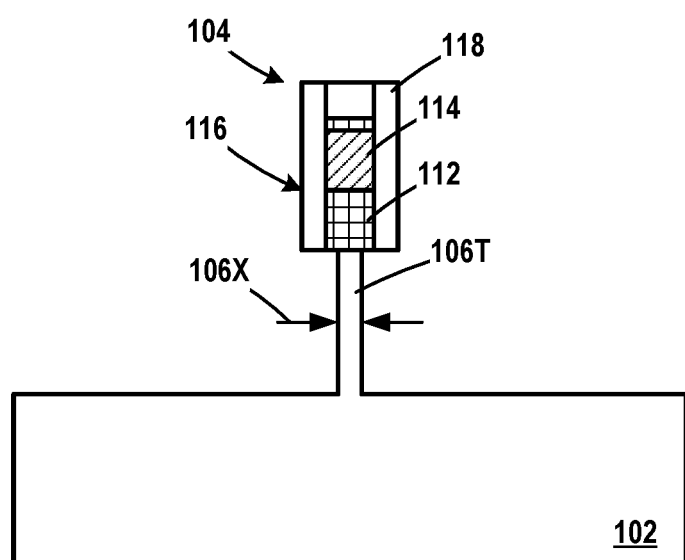

FIG. 6 depicts the product 100 after a VOS structure trimming etch process, e.g., an isotropic etching process, was performed to reduce the lateral width of the exposed portion of the VOS structure 106. However, it should be noted that the VOS structure trimming etch process may not be performed in at least some applications. More specifically, the process operation results in the formation of a trimmed portion of the VOS structure 106 having a lateral width 106X that is less than a lateral width 106W of the initial VOS structure 106. The amount of trimming or thinning of the trimmed portion of the VOS structure 106 relative to the un-trimmed initial VOS structure 106 may vary depending upon the particular application. For example, in some applications, the lateral width 106X of the trimmed portion of the VOS structure 106 may be about 50% less than the lateral width 106W of the initial VOS structure 106. In some applications, the lateral width 106X of the trimmed portion of the VOS structure 106 may be on the order of a few nanometers. As noted above, the axial length (or vertical height) of the initial VOS structure 106 that is exposed to this trimming process may vary depending upon the particular application.

Figure 7:
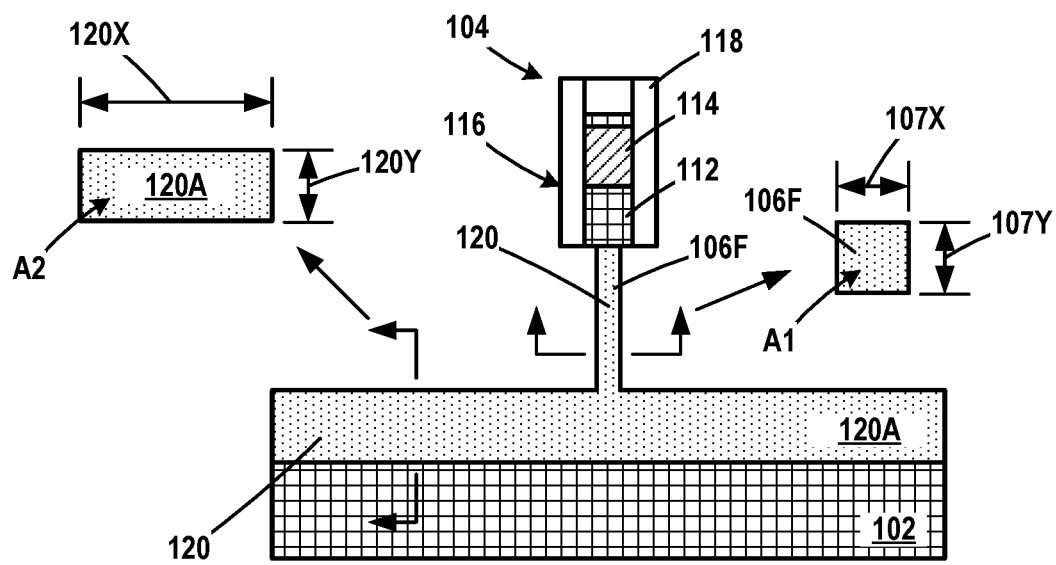

FIG. 7 depicts the product after various well-known metal silicide formation process operations were performed to form metal silicide material 120 on the product 100. More specifically, a conformal layer of metal (not shown) was deposited on the product by performing a conformal deposition process. Thereafter, a heating or anneal process was performed to cause the layer of metal to react with the exposed portions of the substrate 102 and the exposed portion of the VOS structure 106 (which in the depicted example has been trimmed) and thereby form the metal silicide material 120. Then, unreacted portions of the layer of metal were stripped from the product 100. In some cases, a second anneal process may be performed after the unreacted metal has been removed. These process operations result in the formation of a conductive metal silicide region 120A in the substrate 102 and the formation of a conductive silicide vertically oriented e-fuse 106F. In the depicted example, the metal silicide material 120 extends throughout the entire dimension 106X (i.e., lateral width) of the trimmed portion of the VOS structure 106 for at least some portion of the axial length (i.e., vertical height) of the trimmed portion of the VOS structure 106. In some cases, the metal silicide material 120 extends throughout the entire dimension 106X (i.e., lateral width) of the trimmed portion of the VOS structure 106 for substantially the entire axial length (i.e., vertical height) of the VOS structure 106. The metal silicide material 120 may be formed to any desired thickness, and it may be comprised of any desired material, e.g., cobalt silicide, titanium silicide, nickel silicide, etc. The conductive metal silicide region 120A in the semiconductor substrate 102 is conductively coupled to the conductive silicide vertically oriented e-fuse 106F. As described more fully below, during operations, an electrical current will flow through the conductive silicide vertically oriented e-fuse 106F and the conductive metal silicide region 120A. The conductive silicide vertically oriented e-fuse 106F has a cross-sectional current flow area A1 that is equal to the dimension 107X times the dimension 107Y. The conductive metal silicide region 120A has a cross-sectional current flow area A2 that is equal to the dimension 120X times 120Y. Importantly, the flow area A1 of the conductive silicide vertically oriented e-fuse 106F is less than the flow area A2 of the conductive metal silicide region 120A. \The difference between the size of the cross-sectional areas A1 and A2 may vary depending upon the particular application. In one illustrative embodiment, the area A1 may be at least 25% smaller than the area A2.

Figure 8:
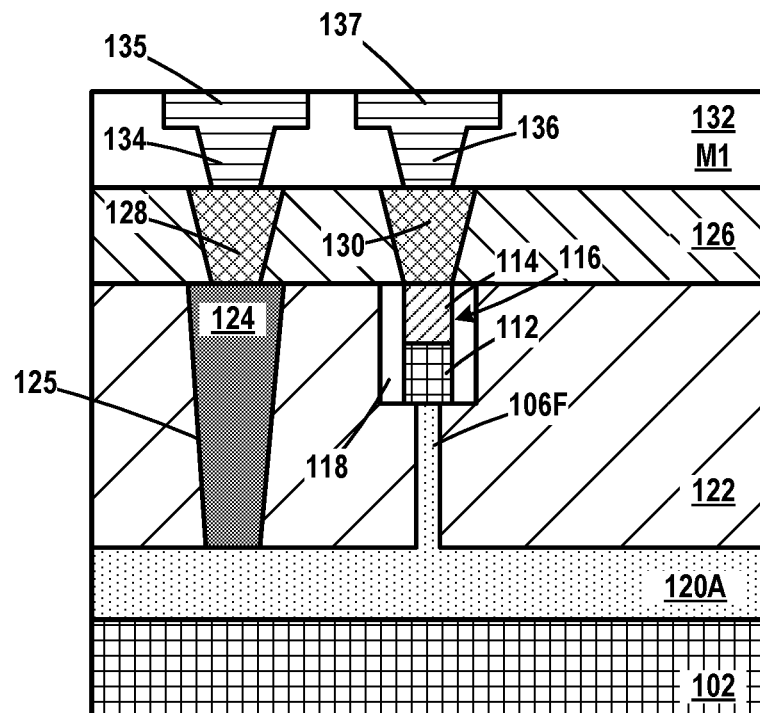
Figure 9:
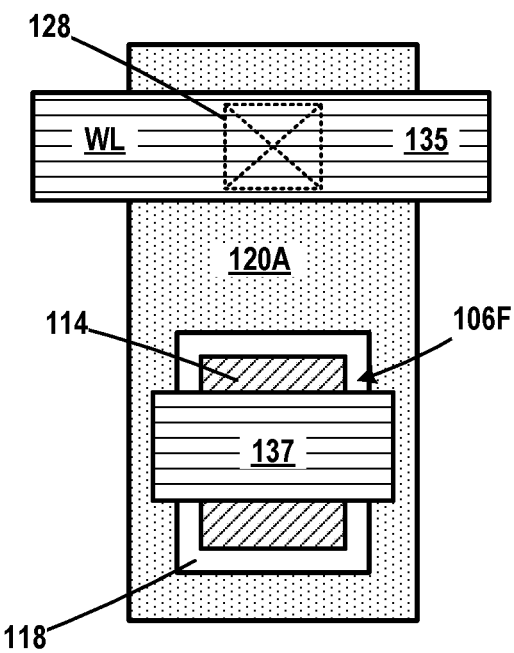

FIG. 8 is a cross-sectional view that depicts the product 100 after various process operations were performed to form various conductive structures that are conductively coupled to the vertically oriented e-fuse 106F. FIG. 9 is a plan view of a unit cell comprising the conductive silicide vertically oriented e-fuse 106F after the formation of the various conductive structures shown in FIG. 8. In terms of process operations, a layer of insulating material 122 was initially formed above the product 100. In one embodiment, the layer of insulating material 122 was formed by performing a deposition process so as to over-fill the trenches 105 with insulating material. Thereafter, several process operations, such as etching, cleaning and CMP, were performed to planarize the upper surface of the layer of insulating material 122 and remove the patterned etch mask 104 and expose the second doped region 114. The layer of insulating material 122 is intended to be representative in nature as it may be comprised of one or more layers of insulating material, e.g., silicon dioxide, silicon nitride, a low-k material, etc. Then, a conductive contact structure 124 that is conductively coupled to the metal silicide region 120A was formed in the layer of insulating material 122. The conductive contact structure 124 may be formed by performing one or more etching processes through a patterned etch mask (not shown) to remove exposed portions of the layer of insulating material 122 and define an opening 125 that exposes the metal silicide region 120A. Thereafter, one or more conductive materials are formed in the opening 125 and a CMP process was performed to remove excess amounts of the conductive materials positioned above the upper surface of the layer of insulating material 122. At that point, conductive contact structures 128, 130 may be formed in another layer of insulating 126, wherein the contact structure 128 conductively contacts to the conductive contact structure 124 and the contact structure 130 conductively contacts the diode 116. After forming contact openings in the layer of insulating material 126, if desired, a metal silicide material (not shown) may be formed on the doped region 114 to reduce contact resistance. The conductive contact structures 128, 130 are intended to be representative in nature as they may be of any desired size, shape or configuration, and they may be comprised of any desired conductive material. In one illustrative example, the conductive contact structures 128, 130 may be formed at the same time as various source/drain (CA) contact structures (not shown) and various gate (CB) contact structures (not shown) are formed for various transistor devices (not shown) that are formed above the substrate 102. Additionally, the layer of insulating material 126 is intended to be representative in nature as it may be comprised of one or more layers of insulating material, e.g., silicon dioxide, silicon nitride, a low-k material, etc.

Also depicted in FIGS. 8 and 9 is a simplistically depicted illustrative metallization layer, e.g., the M1 metallization layer, for the IC product 100 that was formed above the layer of insulating material 126. In practice, the M1 metallization layer may comprise conductive vias 134 and 136 (also referred to as "V0" structures) and conductive lines 135 and 137 (also referred to as "M1" lines) that are formed in a layer of insulating material 132. In general, the M1 level is the first major wiring level of the product 100 that establishes the means by which the various circuits formed on the product are conductively coupled together to form a functioning integrated circuit product. Typically, a modern integrated circuit product will have several metallization layers formed above the M1 metallization layer. As will be appreciated by those skilled in the art after a complete reading of the present application, the conductive line 135 of the M1 metallization layer will function as a word line for a single unit cell (that comprises a single conductive silicide vertically oriented e-fuse 106F) when a plurality of such unit cells are arranged in a one-time programmable memory array, as disclosed more fully below.

Figure 10:
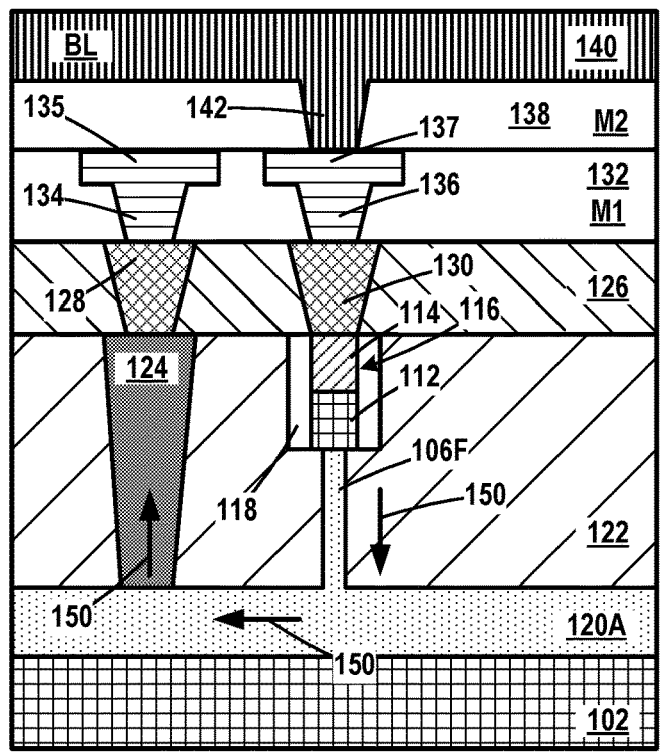
Figure 11:
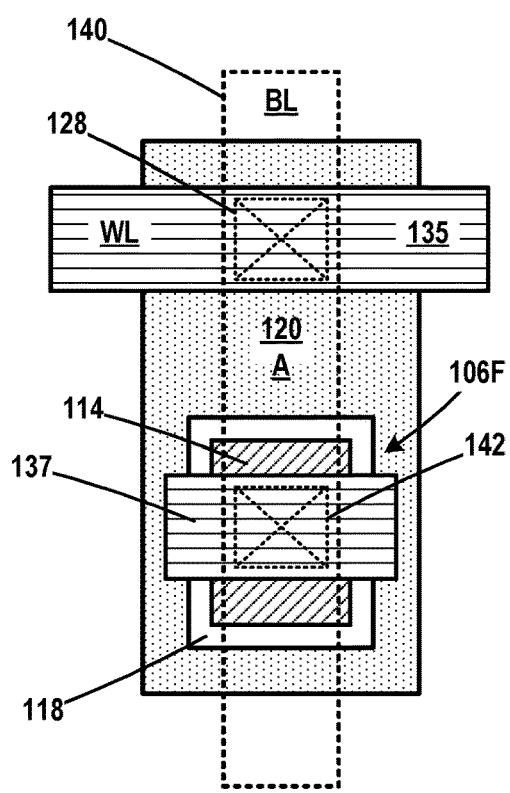

FIG. 10 is a cross-sectional view that depicts the product 100 after various process operations were performed to form a second metallization layer ("M2/V1") above the M1 metallization layer. FIG. 11 is a plan view of a unit cell (that comprises a single conductive silicide vertically oriented e-fuse 106F) after the formation of the M2 metallization layer. The M2 metallization layer comprises a via 142 (also referred to as "V1" structure) and a conductive line 140 (also referred to as an "M2" line) that are formed in a layer of insulating material 138. The layer of insulating material 138 is intended to be representative in nature as it may be comprised of one or more layers of insulating material, e.g., silicon dioxide, silicon nitride, a low-k material, etc. As will be appreciated by those skilled in the art after a complete reading of the present application, the conductive line 140 of the M2 metallization layer will function as a bit line for a single unit cell (that comprises a single conductive silicide vertically oriented e-fuse 106F) when a plurality of such unit cells are arranged in a one-time programmable memory array, as disclosed more fully below.

With reference to FIG. 10, as initially formed, the silicide vertically oriented e-fuse 106F is adapted to be part of a conductive flow path for an electron current 150 that is generated by application of appropriate voltages to the conductive structures 128, 130. In the depicted example, the electron current 150 is depicted as flowing downward through the silicide vertically oriented e-fuse 106F, through the metal silicide region 120A and upward through the conductive structure 124. Given the relatively smaller size (cross-sectional area) of the silicide vertically oriented e-fuse 106F as compared to the size of the metal silicide region 120A formed in the substrate 102, there will be a higher electron current density in the silicide vertically oriented e-fuse 106F. Thus, by having the electron current 150 pass downward into the metal silicide region 120A, the relatively higher density electron current flowing through the silicide vertically oriented e-fuse 106F may be more readily dissipated into the larger area provided by the metal silicide region 120A. The direction of flow of the electron current 150 may be controlled by a variety of techniques. For example, the direction of flow of the electron current 150 may be controlled by changing the polarity of the voltages applied to the conductive contacts 128, 130 and by doping of the first and second doped regions 112, 114 to form a P-N configuration. As will be appreciated by those skilled in the art after a complete reading of the present application, the silicide vertically oriented e-fuse 106F is designed such that, when sufficient electron electrical current is passed through the silicide vertically oriented e-fuse 106F, the e-fuse 106F will rupture and thereby prevent the flow of electron current through the e-fuse 106F, i.e., the conductive flow path through the e-fuse 106F will be broken. Rupturing the e-fuse 106F may also be referred to as programming the e-fuse 106. The magnitude of the current needed to rupture the e-fuse 106F may vary depending upon the particular application.

Figure 12:
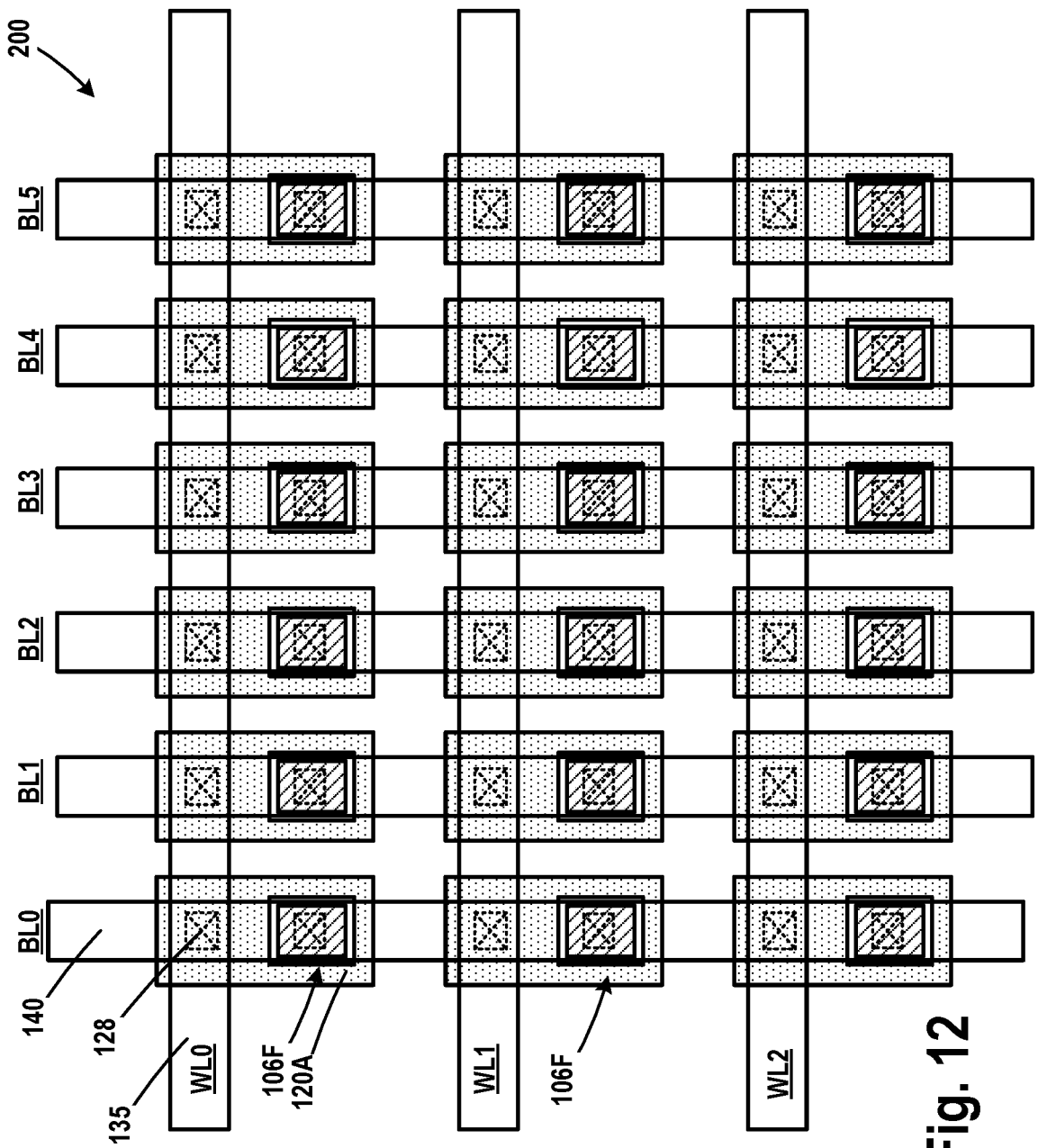

FIG. 12 is a simplistic plan view of one illustrative embodiment of a one-time programmable memory array 200 disclosed herein that is comprised of a plurality of unit cells, each of which comprises a single silicide vertically oriented e-fuse 106F disclosed herein. As indicated above, in one embodiment, a conductive line 135 of the M1 metallization layer functions as a word line for each of the unit cells arranged along a given row in the array 200, while a conductive line 140 of the M2 metallization layer functions as a bit line for each of the unit cells arranged in a particular column of the array 200. A single unit cell within the array 200 may be accessed by applying an appropriate voltage to one of the word lines and one of the bit lines. At that point, the current may be increased to rupture the e-fuse 106F for the particular unit cell that was accessed. The programed unit cell (with the ruptured e-fuse 106F) may represent a logically high value (e.g., a "1"), while a non-programmed unit cell (with a non-ruptured e-fuse 106F) may represent a logically low value (e.g., a "0"). Of course, if desired, the logical representation of the programmed and non-programmed unit cells may be reversed if desired.

Figure 13:
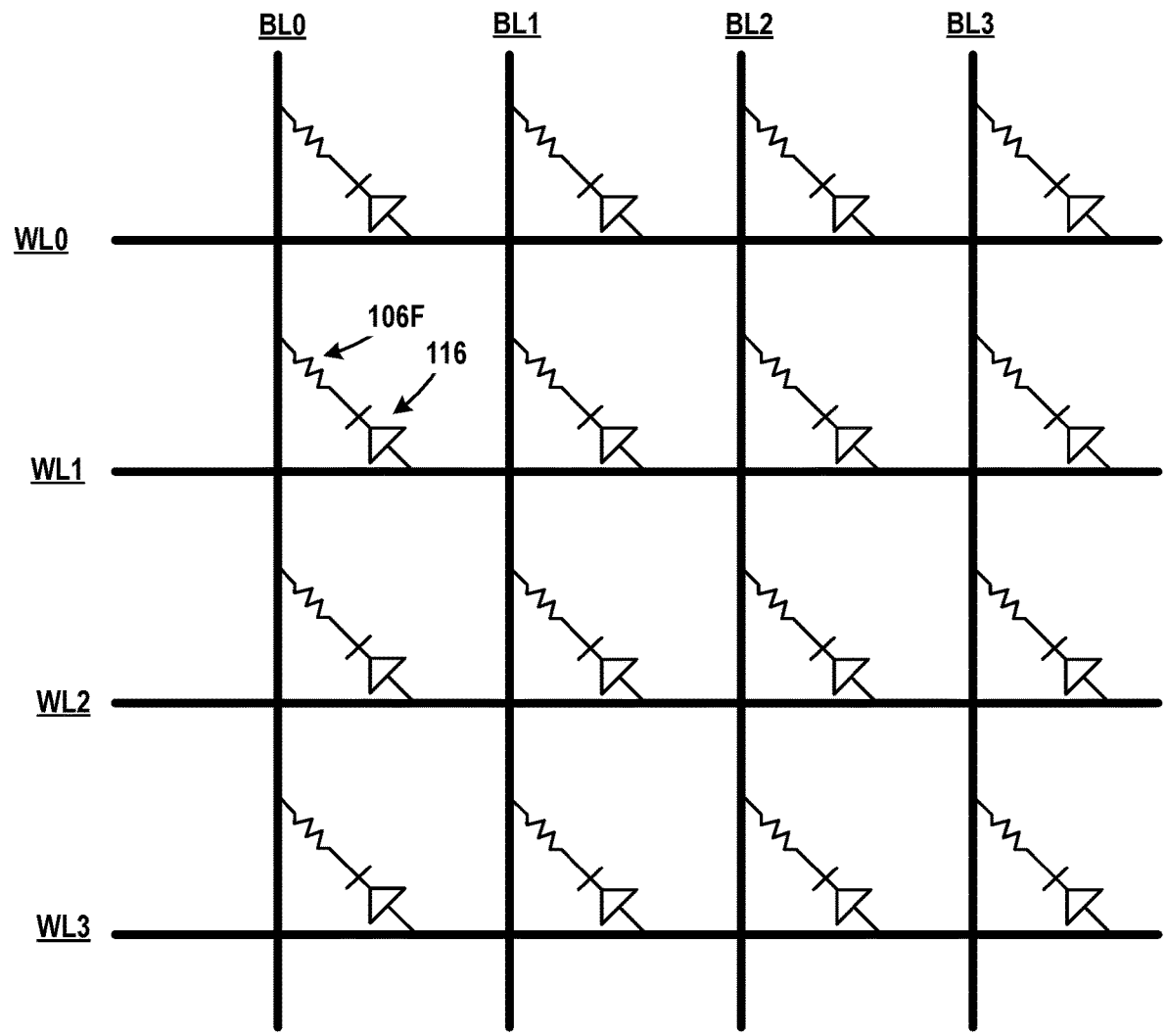

FIG. 13 is a simplistic schematic of the array 200 showing the schematically depicted diode 116 and the schematically depicted silicide vertically oriented e-fuse 106F arranged in the array 200. Of course, as noted above, the diode 116 may be configured such that current flow through the diode 116 will be in the direction opposite to that shown in FIG. 13.

Figure 14:
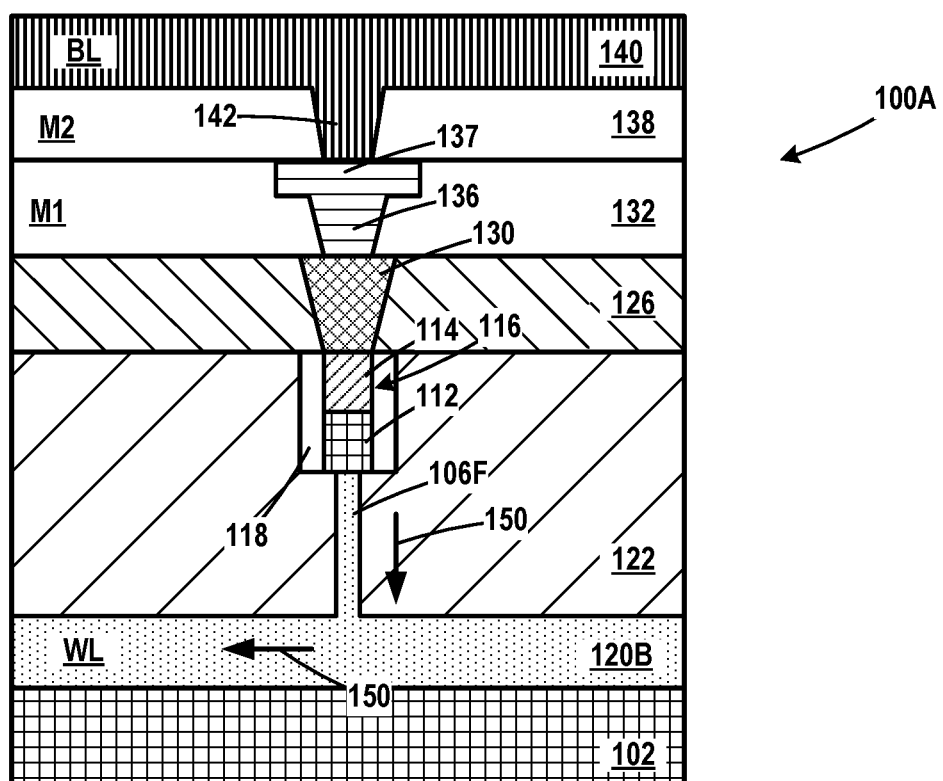
Figure 15:
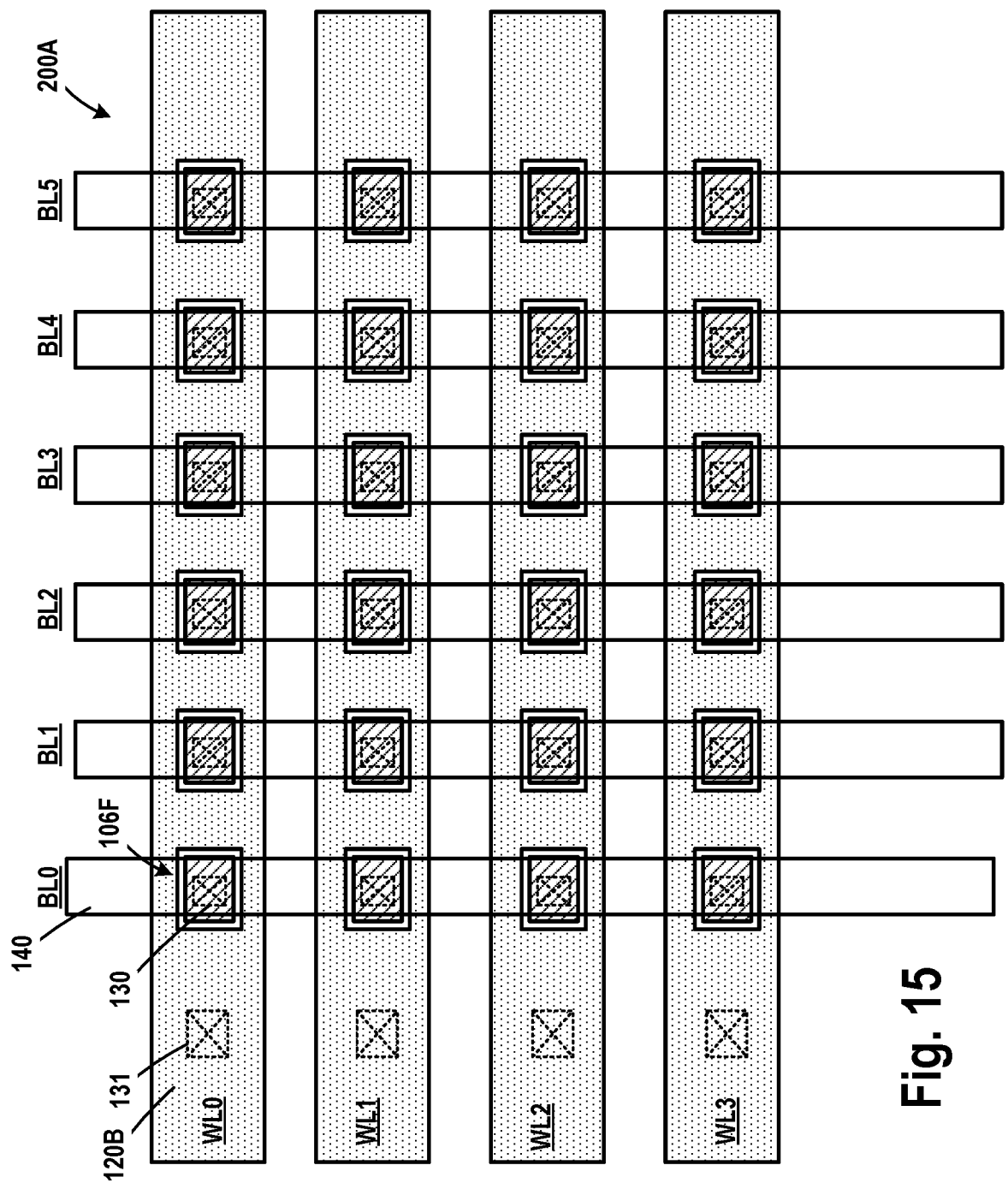

FIGS. 14 and 15 depict another illustrative embodiment of a novel vertically oriented metal silicide containing e-fuse device 106F for use on an IC product 100A. FIG. 14 is a cross-sectional view of the e-fuse 106F while FIG. 15 is a plan view of another illustrative embodiment of a one-time programmable memory array 200A that comprises a plurality of silicide vertically oriented e-fuses 106F. Relative to the previous embodiment, rather than individual unit cells each comprised of a separate metal silicide region 120A and a separate conductive structure 124, a single metal silicide region 120B is formed in the substrate 102, and a single contact structure 131 (see FIG. 15—not shown in FIG. 14) is conductively coupled to the single metal silicide region 120B. Also note that, in this embodiment, the single metal silicide region 120B functions as the word line that permits individually accessing each of the e-fuses 106F in the array 200A. In this example, the conductive lines 140 in the M2 metallization layer may still function as the bit lines in the array 200A. The conductive metal silicide region 120B in the semiconductor substrate 102 is conductively coupled to the conductive silicide vertically oriented e-fuses 106F. Similar to the embodiment discussed above, the conductive silicide vertically oriented e-fuse 106F has a cross-sectional current flow area A1 that is less than the flow area A2 of the conductive metal silicide region 120B.

Figure 16:
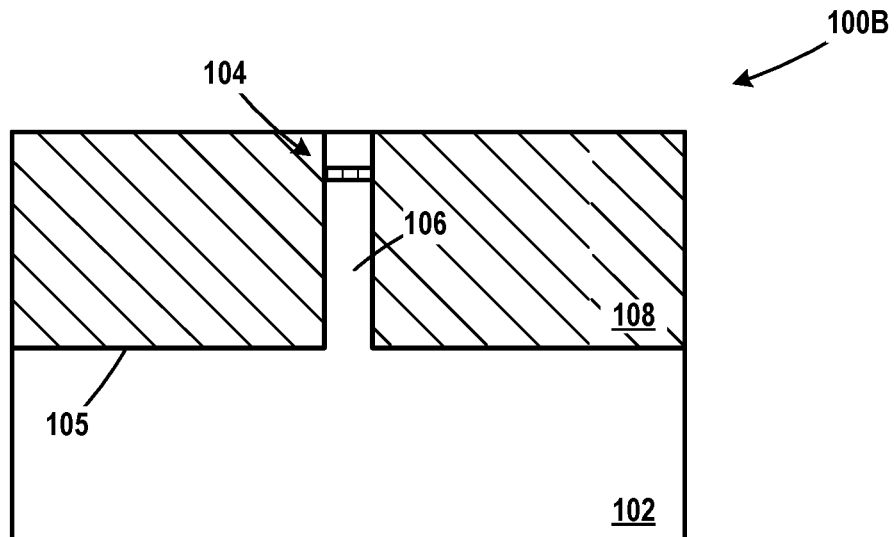

FIGS. 16-21 are various views of another illustrative embodiment of a novel vertically oriented metal silicide e-fuse device 106F for use on an IC product 100B. FIG. 16 depicts the product 100B after the formation of the VOS structure 106 and the formation of the layer of insulating material 108.

Figure 17:
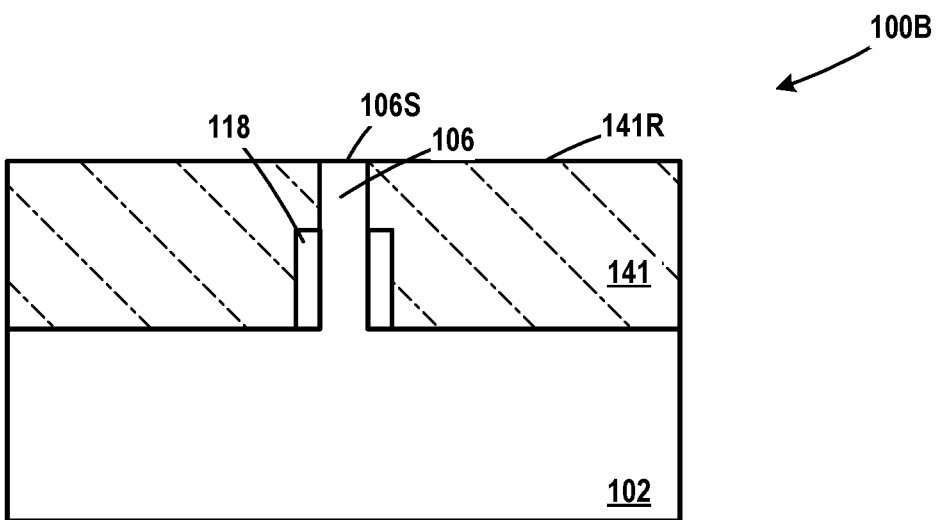

FIG. 17 depicts the product 100B after several process operations were performed. First, the layer of insulating material 108 was removed. Then, the above-described sidewall spacer 118 was formed adjacent the VOS structure 106 above the substrate 102. In this example, the spacer 118 is formed such that it has a reduced height and does not cover the entire axial length (i.e., vertical height) of the VOS structure 106, i.e., in one embodiment, the spacer 118 may only cover about ⅔ of the axial length of the VOS structure 106. The reduced height spacer 118 may be formed using a variety of techniques. For example, the spacer 118 may be initially formed such that it covers the entire axial length of the VOS structure 106. At that point, a recessed layer of insulating material (not shown), e.g., silicon dioxide, may be formed in the trenches adjacent the initial full-height sidewall spacer, wherein the recessed upper surface of the recessed layer of insulating material exposes the desired amount of the initial full-height spacer to be removed. The exposed portion of the initial full-height spacer is then removed by performing an etching process, and the recessed layer of insulating material is then removed. Then, a layer of insulating material 141 was blanket-deposited on the product. Next, a first CMP process was performed on the layer of insulating material 141 that stopped on the upper surface of the patterned etch mask 104. The patterned etch mask 104 was then removed by performing an etching process. At that point, a second CMP process was performed that stopped on the upper surface 106S of the VOS structure 106 such that the layer of insulating material 141 has a recessed upper surface 141R.

Figure 18:
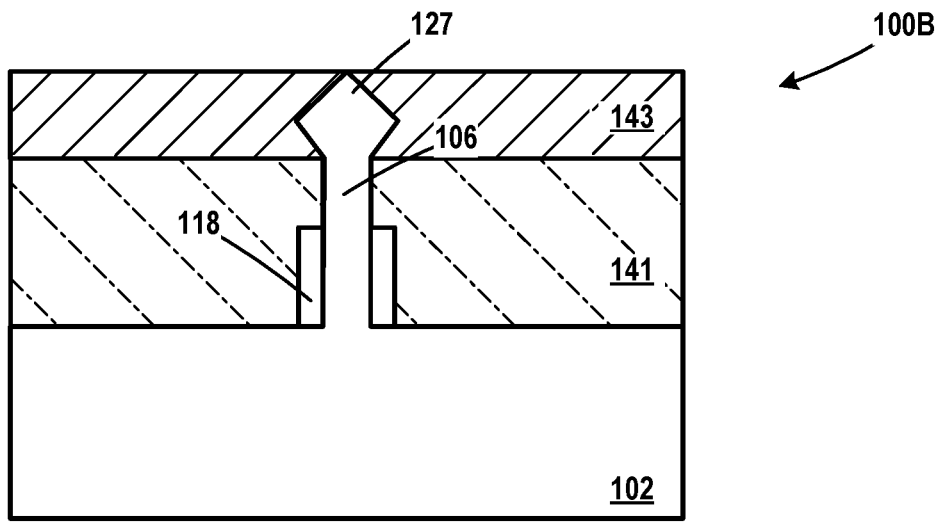

FIG. 18 depicts the product 100B after several process operations were performed. First, an epitaxial growth process was performed to form a region of epitaxial semiconductor material 127 on the upper surface 106S (see FIG. 17) of the VOS structure 106. Then, a layer of insulating material 143 (e.g., silicon dioxide) was blanket-deposited on the product. Next, a CMP process was performed on the layer of insulating material 143 that stopped at or near the uppermost surface of the epi material 127.

Figure 19:
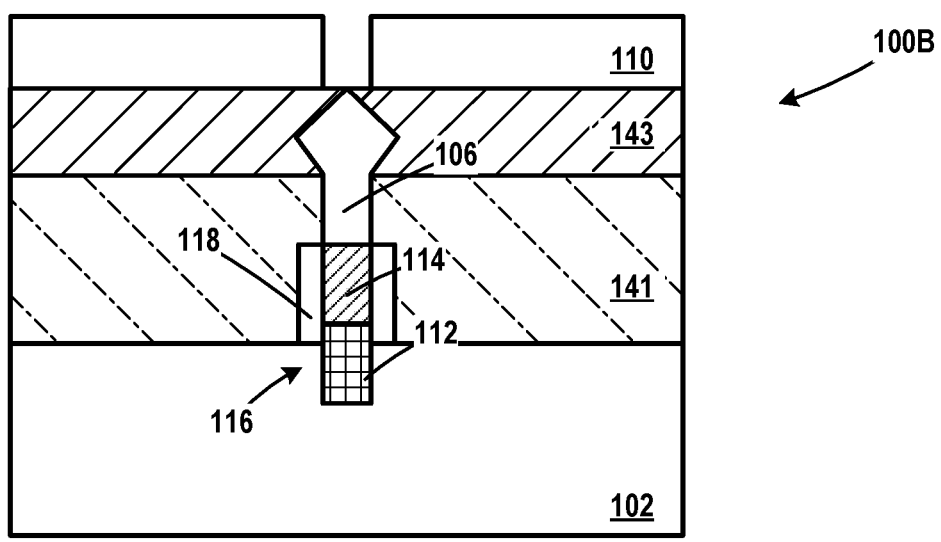

FIG. 19 depicts the product 100B after several process operations were performed. First, the above-described patterned implant mask 110 was formed above the layer of insulating material 143. Thereafter, the above-described first and second doped regions 112, 114 were formed in the VOS structure 106. However, in this embodiment, the first doped region 112 is formed such that it extends at least partially into the substrate 102 beneath the VOS structure 106. As before, the size, depth and position of the doped regions 112, 114, as well as the dopants in the doped regions, may vary depending upon the particular application.

Figure 20:
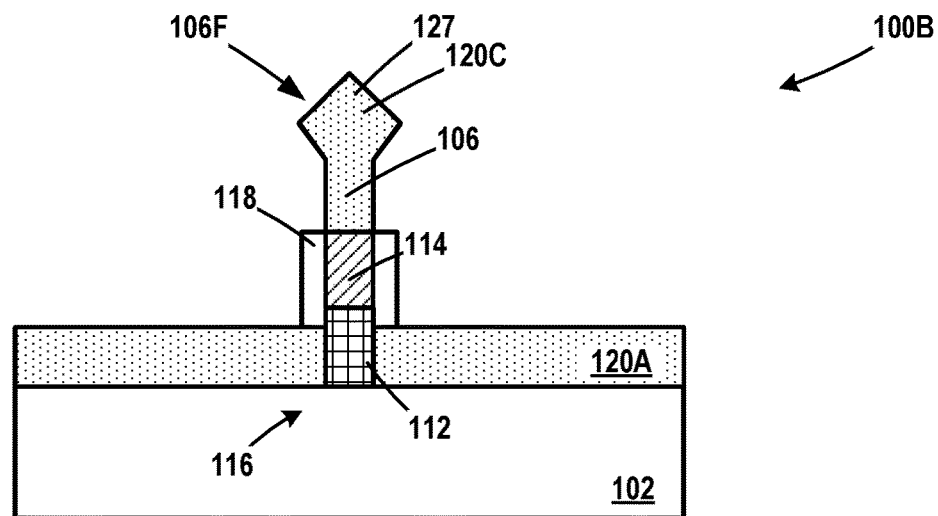

FIG. 20 depicts the product 100B after several process operations were performed. First, the patterned mask layer 110 and the layers of insulating materials 143 and 141 were removed. At that point, well-known metal silicide operations (described above) were performed to form the above-described metal silicide material 120A in the substrate 102 and metal silicide material 120C in the epi material 127 and the upper portion of the VOS structure 106. The metal silicide material 120C constitutes the above-described conductive silicide vertically oriented e-fuse 106F. In this embodiment, the metal silicide process was performed in such a manner so that the metal silicide material extends under the sidewall spacer 118 but, in one example, does not consume the entire first doped region 112.

Figure 21:
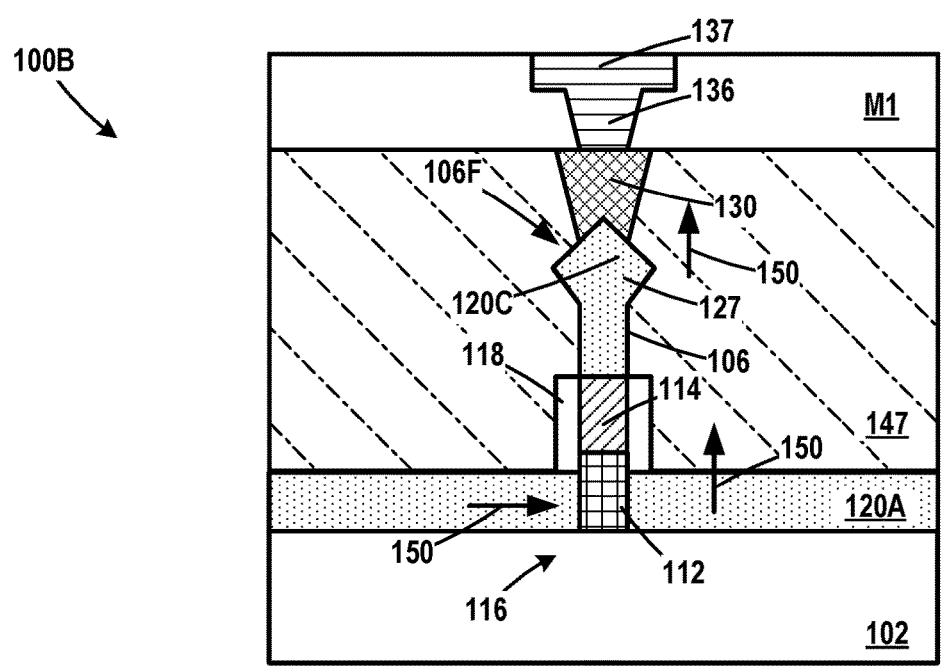

FIG. 21 depicts the product 100B after several process operations were performed. First, a layer of insulating material 147 (e.g., silicon dioxide) was blanket-deposited on the product. Next, a CMP process was performed on the layer of insulating material 147 to planarize its upper surface. Then, various process operations were performed to form the above-described conductive structure 130 and the M1 metallization layer on the product 100B. Note that, in this example, when the first doped region 112 is an N-doped region and the second doped region 114 is a P-doped region, the electron current 150 may flow vertically upward through the vertically oriented e-fuse 106F.

Figure 22:
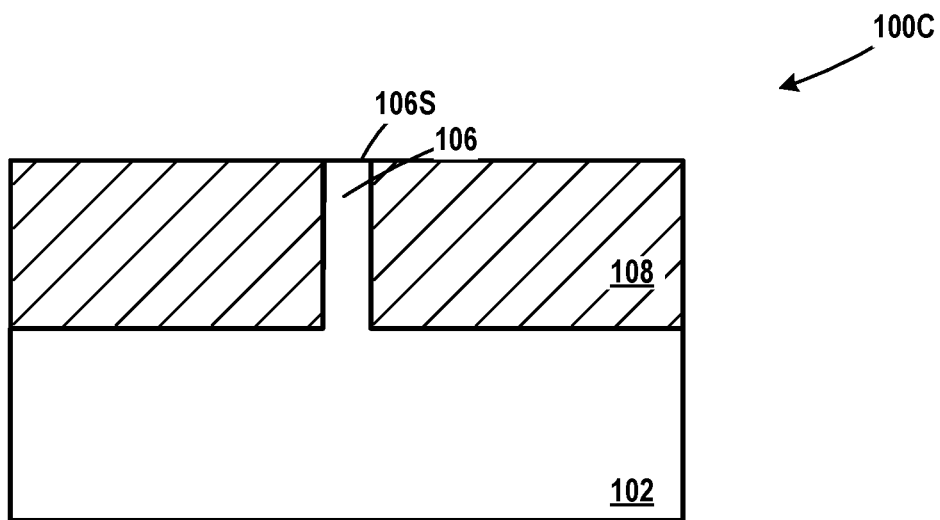

FIGS. 22-28 are various views of another illustrative embodiment of a novel vertically oriented metal silicide e-fuse device 106F for use on an IC product 100C. FIG. 22 depicts the product 100C at a point in processing after the formation of the VOS structure 106, after the above-described layer of insulating material 108 was formed on the product and recessed, and after a CMP process was performed that exposes the upper surface 106S of the VOS structure 106.

Figure 23:
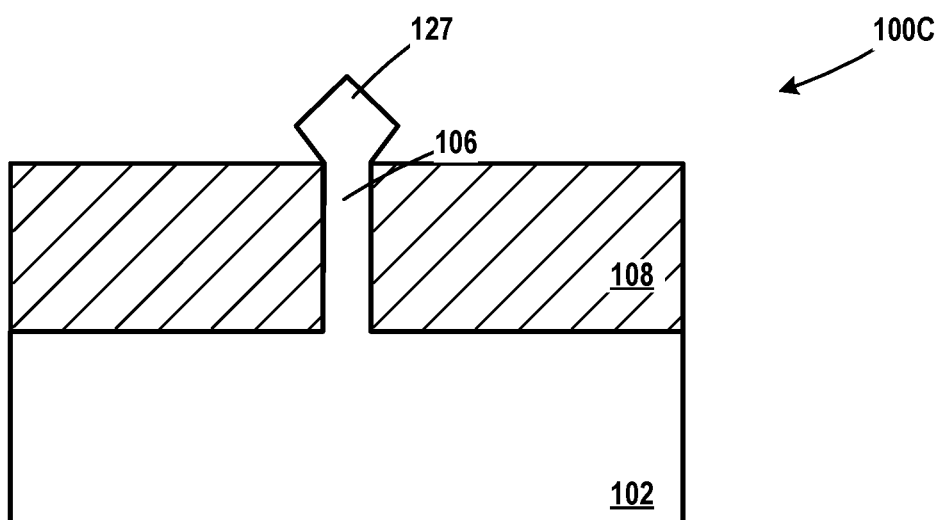

FIG. 23 depicts the product 100C after the above-described epitaxial growth process was performed to form a region of the above-described epitaxial semiconductor material 127 on the upper surface 106S of the VOS structure 106.

Figure 24:
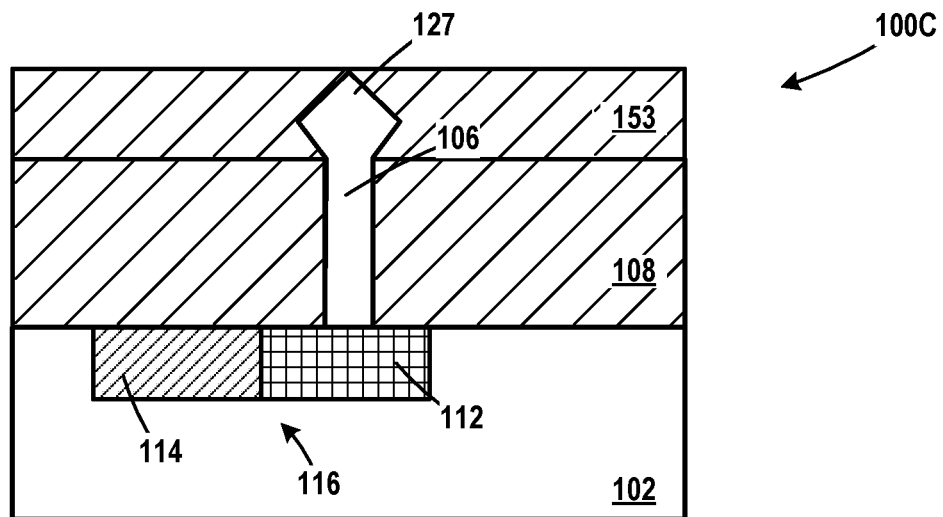

FIG. 24 depicts the product 100C after several process operations were performed. First, a layer of insulating material 153 (e.g., silicon dioxide) was blanket-deposited on the product. Next, a CMP process was performed on the layer of insulating material 153 that stopped at or near the uppermost surface of the epi material 127. Then, the above-described first and second doped regions 112, 114 were formed in the substrate 102 so as to define the diode 116. In the depicted example, the first doped region 112 is positioned vertically under the VOS structure 106, while the second doped region 114 is positioned laterally adjacent the first doped region 112. In one illustrative process flow, the doped regions 112, 114 may be formed by performing separate ion implantation processes through separate patterned implant masking layers (not shown) that are formed above the substrate 102.

Figure 25:
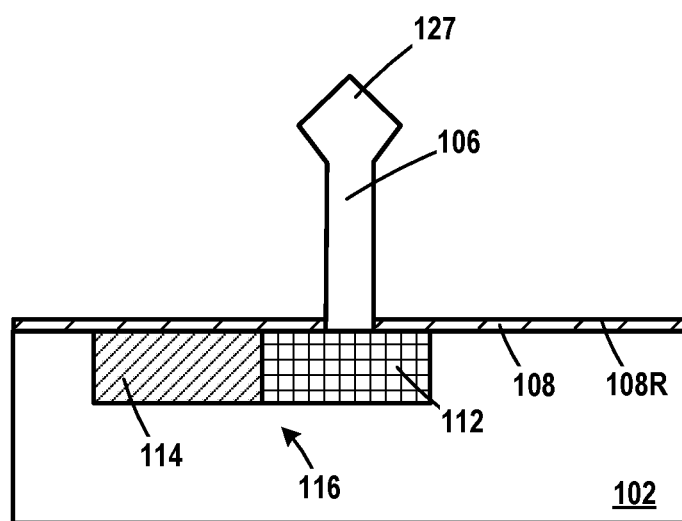

FIG. 25 depicts the product 100C after one or more etching processes were performed to remove the layer of insulating material 153 and to recess the layer of insulating material 108 such that it has a recessed upper surface 108R that exposes a portion of the VOS structure 106. The amount of recessing of the layer of insulating material 108 may vary depending upon the particular application. In one illustrative embodiment, the recessing of the layer of insulating material 108 may expose substantially all of the VOS structure 106.

Figure 26:
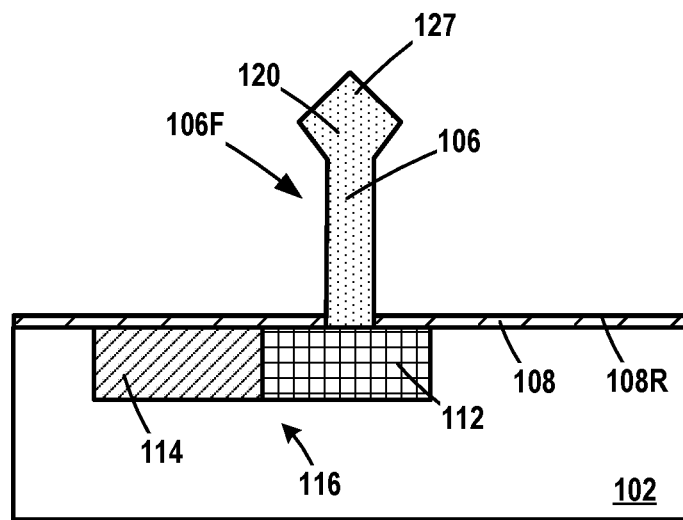

FIG. 26 depicts the product 100C after several process operations were performed. At that point, well-known metal silicide operations (described above) were performed to form the above-described metal silicide material 120 in the VOS structure 106. In the depicted example, the metal silicide material 120 extends throughout the entire lateral dimension (i.e., lateral width) of the exposed portion of the VOS structure 106. These process operations result in the formation of the above-described conductive silicide vertically oriented e-fuse 106F. The diode 116 (the combination of the first and second doped regions 112, 114) is conductively coupled to the conductive silicide vertically oriented e-fuse 106F.

Figure 27:
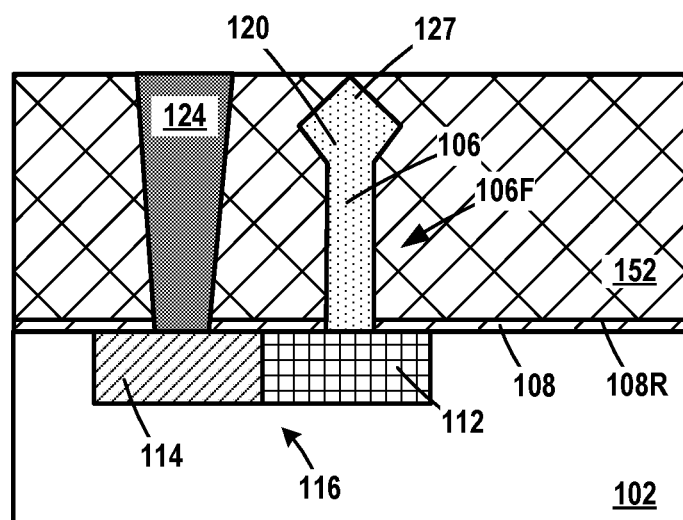

FIG. 27 depicts the product 100C after several process operations were performed. First, a layer of insulating material 152, such as silicon dioxide, was deposited so as to over-fill the trenches 105 such that insulating material 152 was positioned above the upper surface of the epi material 127. Thereafter, a CMP process was performed to planarize the upper surface of the deposited layer of insulating material 152 with the upper surface of the epi material 127. At that point, the above-described conductive contact structure 124 was formed in the layer of insulating material 152.

Figure 28:
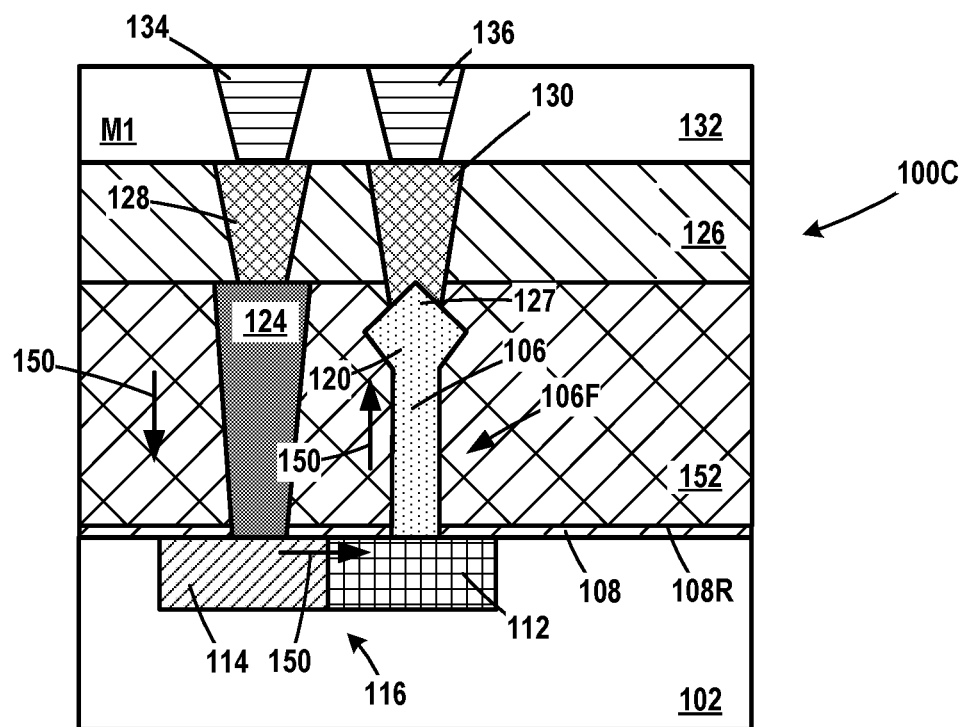

FIG. 28 depicts the product 100C after various process operations were performed to form the above-described conductive structures 128, 130 and the M1 metallization layer on the product 100C. Note that, in this example, when the first doped region 112 is a P-doped region and the second doped region 114 is an N-doped region, the electron current 150 may flow vertically upward through the vertically oriented e-fuse 106F.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a vertically oriented semiconductor (VOS) structure in a semiconductor substrate;
   forming first and second oppositely doped regions in said VOS structure, said first and second oppositely doped regions constituting a diode; and
   performing a metal silicide formation process to convert at least a portion of said VOS structure into a metal silicide material, thereby forming a conductive silicide vertically oriented e-fuse, wherein said first and second oppositely doped regions are positioned vertically above said conductive silicide vertically oriented e-fuse and wherein said first and second oppositely doped regions are formed prior to performing said metal silicide formation process.

2. The method of claim 1, wherein performing said metal silicide formation process forms said metal silicide material throughout an entire lateral width of said VOS structure along at least some portion of an axial length of said VOS structure.

3. The method of claim 1, wherein performing said metal silicide formation process further forms a conductive metal silicide region in said semiconductor substrate that is conductively coupled to said conductive silicide vertically oriented e-fuse.

4. The method of claim 1, wherein, prior to performing said metal silicide formation process, the method further comprises performing a trimming etching process on a portion of an entire vertical height of said VOS structure to form a thinned VOS portion and wherein performing said metal silicide formation process converts at least a portion of an axial length of said thinned VOS structure into a metal silicide material, thereby forming said conductive silicide vertically oriented e-fuse.

5. A method, comprising:
forming a vertically oriented semiconductor (VOS) structure in a semiconductor substrate;
forming a layer of insulating material above said semiconductor substrate and laterally adjacent to and surrounding said VOS structure;
forming a patterned mask layer above said layer of insulating material;
performing a plurality of implantation processes through said patterned mask layer and in the presence of said layer of insulating material layer to form first and second oppositely doped regions at least partially in said VOS structure, said first and second oppositely doped regions constituting a diode;
forming a sidewall spacer adjacent to sidewalls of said VOS structure, said sidewall spacer laterally enclosing at least a portion of each of said first and second oppositely doped regions; and
performing a metal silicide formation process to convert at least a portion of said VOS structure into a metal silicide material, thereby forming a conductive silicide vertically oriented e-fuse.

6. The method of claim 5, further comprising, after forming said first and second oppositely doped regions, recessing an upper surface of said layer of insulating material so as to expose sidewalls of said first and second oppositely doped regions, wherein said sidewall spacer is formed above said recessed upper surface of said layer of insulating material.

7. The method of claim 6, further comprising, after forming said sidewall spacer, removing said recessed layer of insulating material so as to expose said semiconductor substrate and sidewalls of a lower portion of said VOS structure positioned vertically below said first and second oppositely doped regions.

8. The method of claim 7, further comprising performing a trimming etch process to reduce a lateral width of said exposed lower portion of said VOS structure and thereafter performing said metal silicide formation process, wherein performing said metal silicide formation process further comprises forming a conductive metal silicide region in said semiconductor substrate that is conductively coupled to said conductive silicide vertically oriented e-fuse.

9. The method of claim 5, wherein said sidewall spacer is formed prior to forming said layer of insulating material above said semiconductor substrate, and wherein at least one of said first and second oppositely doped regions is formed at least partially in said semiconductor substrate.

10. The method of claim 9, wherein said layer of semiconductor material is a first layer of semiconductor material, the method further comprising:
forming a region of epitaxial semiconductor material on an upper surface of said VOS structure; and
forming a second layer of insulating material above said first layer of semiconductor material and laterally adjacent to and surrounding said region of epitaxial semiconductor material, wherein said patterned mask layer is formed above said second layer of insulating material.

11. The method of claim 10, wherein performing said metal silicide formation process further comprises converting at least a portion of said region of epitaxial semiconductor material into said metal silicide material and forming a conductive metal silicide region in said semiconductor substrate.

12. A method, comprising:
forming a vertically oriented semiconductor (VOS) structure in a semiconductor substrate;
forming a first layer of insulating material above said semiconductor substrate and laterally adjacent to and surrounding said VOS structure;
forming first and second oppositely doped regions in an upper portion of said VOS structure in the presence of said first layer of insulating material layer, said first and second oppositely doped regions constituting a diode;
removing said first layer of insulating material so as to expose said semiconductor substrate and to expose a lower portion of said VOS structure positioned vertically below said first and second oppositely doped regions;
performing a trimming etch process to reduce a lateral width of said exposed lower portion of said VOS structure; and
performing a metal silicide formation process to convert at least a portion of said lower portion of said VOS structure having said reduced lateral width into a metal silicide material so as to thereby form a conductive silicide vertically oriented e-fuse, and to form a conductive metal silicide region in said semiconductor substrate that is conductively coupled to said conductive silicide vertically oriented e-fuse.

13. The method of claim 12, further comprising forming a patterned mask layer above said first layer of insulating material and performing a plurality of implantation processes through said patterned mask layer to form said first and second oppositely doped regions.

14. The method of claim 12, further comprising:
after forming said first and second oppositely doped regions, recessing an upper surface of said first layer of insulating material so as to expose sidewalls of said first and second oppositely doped regions; and
forming a sidewall spacer adjacent to sidewalls of said first and second oppositely doped regions, wherein said sidewall spacer is formed above said recessed upper surface of said first layer of insulating material, and wherein said recessed first layer of insulating material is removed so as to expose said semiconductor substrate and to expose said lower portion of said VOS structure.

15. The method of claim 12, further comprising:
forming a second layer of insulating material above said semiconductor substrate and laterally adjacent to and surrounding said VOS structure, said second layer of insulating material exposing an upper surface of one of said first and second oppositely doped regions;
forming a third layer of insulating material above said second layer of insulating material; and
forming a first conductive contact element in said third layer of insulating material, said first conductive contact element conductively contacting said exposed upper surface of said one of said first and second oppositely doped regions.

16. The method of claim 15, further comprising:
forming a conductive contact structure in said second layer of insulating material, wherein said conductive contact structure is conductively coupled to said conductive metal silicide region formed in said semiconductor substrate; and forming a second conductive contact element in said third layer of insulating material, wherein said second conductive contact element is conductively coupled to said conductive contact structure formed in said second layer of insulating material.

17. The method of claim 15, further comprising forming a second metal silicide material on at least one of said first and second oppositely doped regions prior to forming said first conductive contact.

18. The method of claim 12, wherein performing said metal silicide formation process comprises forming said metal silicide material throughout an entirety of a lateral width and an axial length of said lower portion of said VOS structure, said lateral width being in a substantially horizontal direction relative to an upper surface of said semiconductor substrate and said axial length being in a substantially vertical direction relative to said upper surface of said semiconductor substrate.

\* \* \* \* \*